(12) United States Patent
Takayanagi et al.

(10) Patent No.: US 8,304,018 B2
(45) Date of Patent: Nov. 6, 2012

(54) COATING METHOD

(75) Inventors: Koji Takayanagi, Koshi (JP); Tomohiro Iseki, Hsin-Chu (TW); Katsunori Ichino, Koshi (JP); Kousuke Yoshihara, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 361 days.

(21) Appl. No.: 12/703,236

(22) Filed: Feb. 10, 2010

(65) Prior Publication Data

US 2010/0209607 A1 Aug. 19, 2010

(30) Foreign Application Priority Data

Feb. 13, 2009 (JP) .................................. 2009-031365
Nov. 18, 2009 (JP) .................................. 2009-263158

(51) Int. Cl.
*B05D 3/12* (2006.01)

(52) U.S. Cl. .......... 427/240; 427/425; 118/52; 118/320; 438/780; 438/782

(58) Field of Classification Search .................. 427/240, 427/425; 118/52, 320; 438/758, 780, 782
See application file for complete search history.

(56) References Cited

U.S. PATENT DOCUMENTS 5,405,813 A * 4/1995 Rodrigues ..................... 438/782
6,117,486 A 9/2000 Yoshihara
2007/0092643 A1* 4/2007 Yoshihara et al. ............ 427/240
2007/0254099 A1 11/2007 Yoshihara et al.
2008/0057194 A1* 3/2008 Tanaka .......................... 427/240
2009/0087559 A1* 4/2009 Yoshihara et al. ............ 427/240
2010/0112209 A1* 5/2010 Yoshihara et al. ............ 427/240

FOREIGN PATENT DOCUMENTS

| JP | 11-260717 A1 | 9/1999 |
| JP | 2001-307984 A1 | 11/2001 |
| JP | 2006-156565 A * | 6/2006 |
| JP | 2007-299941 A1 | 11/2007 |
| WO | WO 2008/111400 A1 * | 9/2008 |

* cited by examiner

*Primary Examiner* — Kirsten Jolley
(74) *Attorney, Agent, or Firm* — Burr & Brown

(57) ABSTRACT

There is provided a coating method which can efficiently apply a coating liquid, such as a liquid resist, to the entire surface of a wafer even when the coating liquid is supplied in a smaller amount than a conventional one, and can therefore reduce the consumption of the coating liquid. The coating method includes: a first step of rotating the substrate at a first rotating speed while supplying the coating liquid onto approximately the center of the rotating substrate; a second step of rotating the substrate at a second rotating speed which is lower than the first rotating speed; a third step of rotating the substrate at a third rotating speed which is higher than the second rotating speed; and a fourth step of rotating the substrate at a fourth rotating speed which is higher than the second rotating speed and lower than the third rotating speed.

9 Claims, 10 Drawing Sheets

COATING METHOD

BACKGROUND OF THE INVENTION

1. Field of the Invention

The present invention relates to a coating method for applying a coating liquid, such as a liquid resist, to a substrate such as a semiconductor wafer.

2. Description of the Related Art

In a photolithography process in the manufacturing of a semiconductor device, process steps, including a resist coating step of applying a liquid resist e.g. onto a semiconductor wafer (hereinafter simply referred to as "wafer") to form a resist film, an exposure step of exposing the resist film in a predetermined pattern and a developing step of developing the exposed resist film, are carried out sequentially to form a predetermined resist pattern on the wafer. In the resist coating step is employed a so-called spin coating method which involves supplying the liquid resist to approximately the center of the surface of the rotating wafer so as to spread the liquid resist on the wafer by centrifugal force, thereby coating the wafer surface with the liquid resist.

In such spin coating method, a wafer is held in a fixed state e.g. by vacuum attraction by means of a spin chuck, and the wafer is rotated together with the spin chuck by a rotary drive means while a liquid resist is dropped from a resist nozzle, disposed above the wafer, onto the center of rotation in the surface of the wafer. The liquid resist spreads radially outward on the wafer by centrifugal force. The wafer continues to be rotated after the dropping of the liquid resist is stopped so that the spread liquid resist is forced out of the wafer and the liquid resist on the wafer is dried.

Such a spin coating method is described, for example, in Japanese Patent Laid-Open Publication No. 2001-307984.

The above-described coating method, however, entails the following problems in carrying out resist coating of a substrate, such as a semiconductor wafer, by supplying a small amount of a liquid resist onto the substrate:

To meet the demand for finer and thinner semiconductor device patterns, various liquid resists which are adapted for such lithography have been developed. Because of the requirement of provision of a variety of physical properties in a liquid resist, the cost of liquid resists is rising faster than ever and is now very precious. The present situation therefore requires further reduction in the consumption of a liquid resist.

However, when a liquid resist is supplied in a small amount onto a substrate and the liquid resist spreads on the substrate outwardly from the center, the liquid resist is unlikely to spread uniformly in a peripheral region of the substrate surface and can spread, for example, like a beard. Once the liquid resist spreads like a beard and a resist film is formed in that pattern, it is not possible to subsequently make the thickness of the resist film uniform at every point. Thus, it has not been possible to uniformly apply a small amount of a liquid resist onto a wafer. Satisfactory reduction in the consumption of a liquid resist has therefore not been achieved as yet.

SUMMARY OF THE INVENTION

The present invention has been made in view of the above situation in the related art. It is therefore an object of the present invention to provide a coating method which can efficiently apply a coating liquid, such as a liquid resist, to the entire surface of a wafer even when the coating liquid is supplied in a smaller amount than a conventional one, and can therefore reduce the consumption of the coating liquid.

In order to achieve the object, the present invention provides a novel coating method as described below.

A coating method for applying a coating liquid to a substrate, comprises: a first step of rotating the substrate at a first rotating speed while supplying the coating liquid onto approximately the center of the rotating substrate; a second step of rotating the substrate at a second rotating speed which is lower than the first rotating speed; a third step of rotating the substrate at a third rotating speed which is higher than the second rotating speed; and a fourth step of rotating the substrate at a fourth rotating speed which is higher than the second rotating speed and lower than the third rotating speed.

In a preferred embodiment of the present invention, the fourth rotating speed is lower than the first rotating speed.

In a preferred embodiment of the present invention, the substrate has been rotated until the start of the first step at a fifth rotating speed which is lower than the first rotating speed, and the fifth rotating speed is gradually and continuously increased after the start of the first step and the rotational acceleration of the substrate is gradually decreased so that the rotating speed of the substrate converges to the first rotating speed by the end of the first step.

In a preferred embodiment of the present invention, the coating liquid is supplied by discharging it from a nozzle, and the supply of the coating liquid is continued from the first step to an intermediate point in the second step and, when terminating the supply of the coating liquid, the liquid supply position on the substrate is displaced from approximately the center of the substrate by moving the nozzle.

The movement of the nozzle may be started simultaneously with the end of the first step.

In a preferred embodiment of the present invention, the coating liquid supplied onto the substrate is spread outwardly from the center of the substrate in the first step, the spread coating liquid is reshaped in the second step, and the reshaped coating liquid is further spread outwardly on the substrate in the third step.

In a preferred embodiment of the present invention, the coating liquid loses its fluidity in the course of the fourth step.

In a preferred embodiment of the present invention, the coating liquid is forced out of the substrate and the coating liquid on the substrate is dried in the fourth step.

In a preferred embodiment of the present invention, the coating liquid is a liquid resist.

According to the present invention, a coating liquid, such as a liquid resist, can be efficiently applied in a smaller amount to the entire surface of a wafer, making it possible to reduce the consumption of the coating liquid.

DETAILED DESCRIPTION OF THE INVENTION

Preferred embodiments of the present invention will now be described with reference to the drawings.

Figure 1:
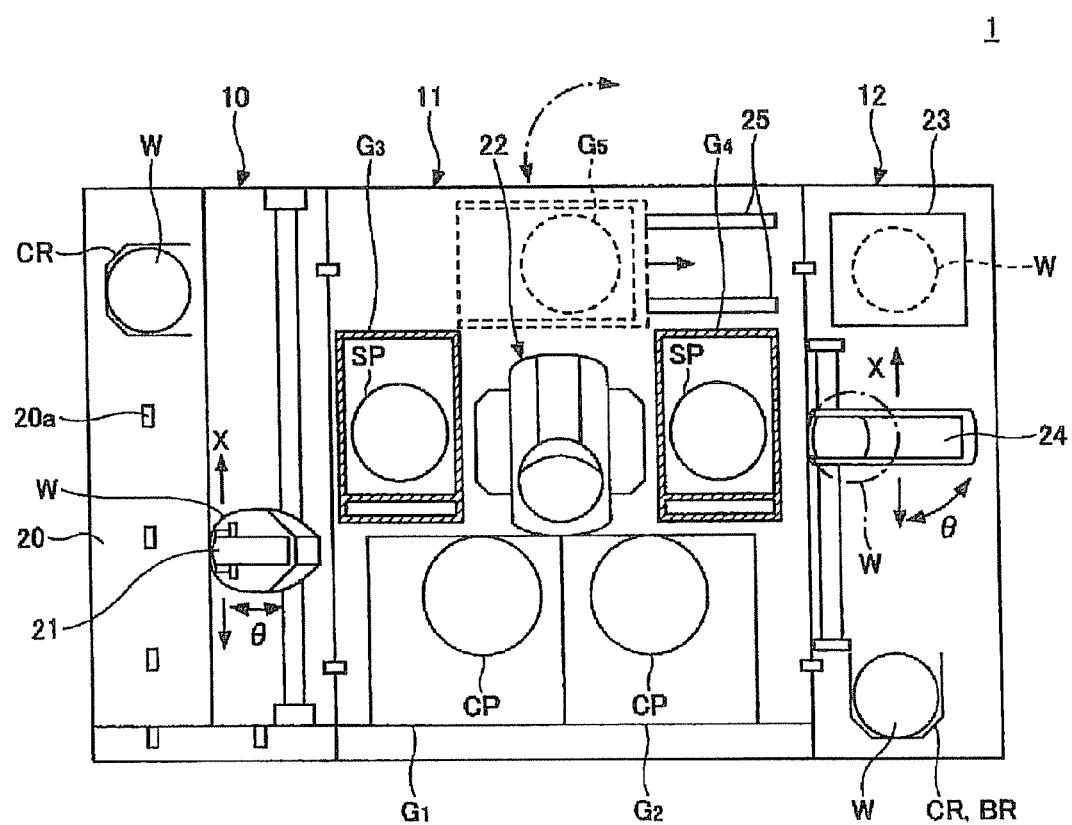
FIG. 1 is a plan view showing the overall construction of a coating/developing system incorporating a resist coating apparatus (unit) for use in carrying out a resist coating method according to an embodiment of the present invention.
Figure 2:
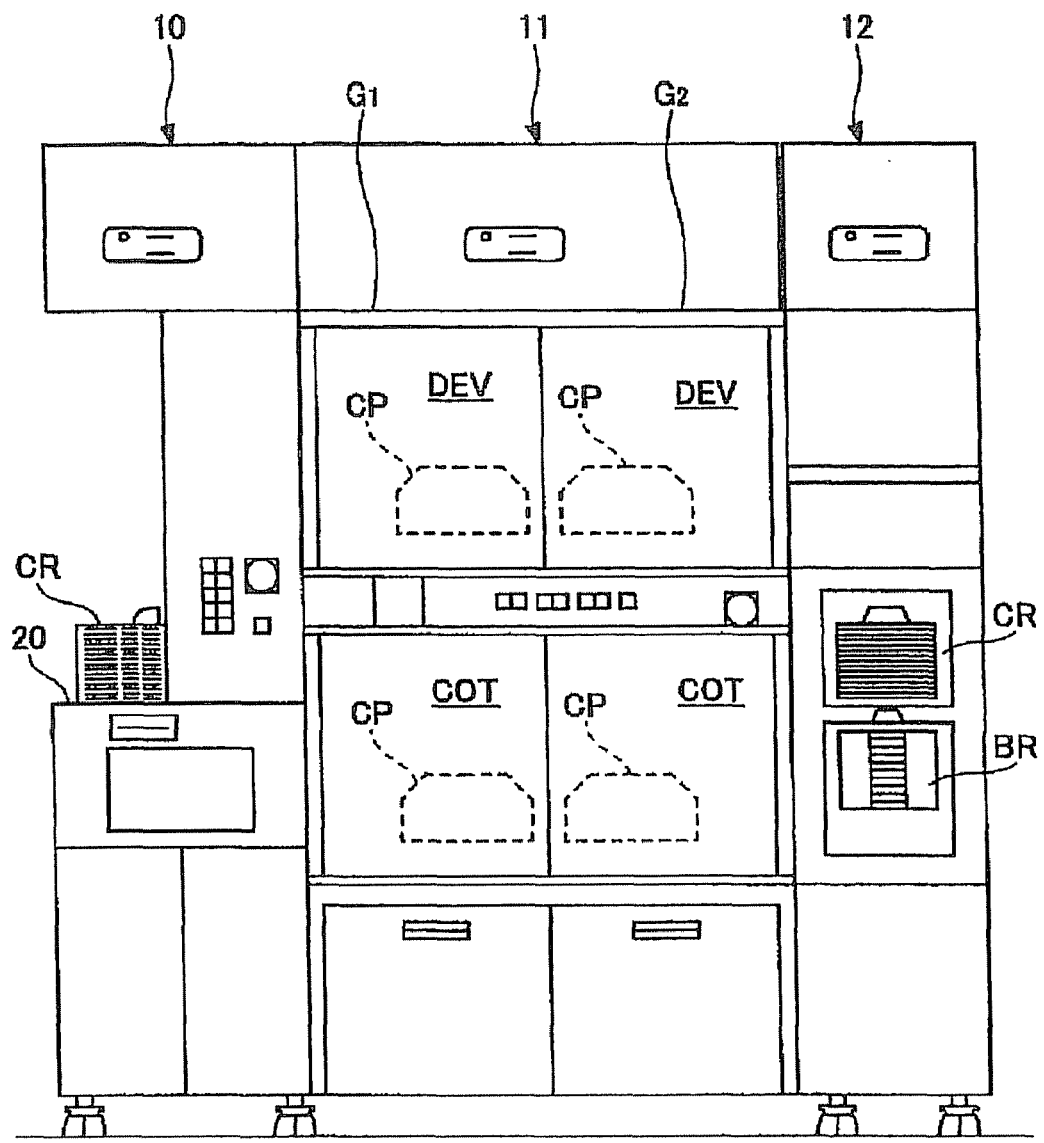
FIG. 2 is a front view showing the overall construction of the coating/developing system of FIG. 1.
Figure 3:
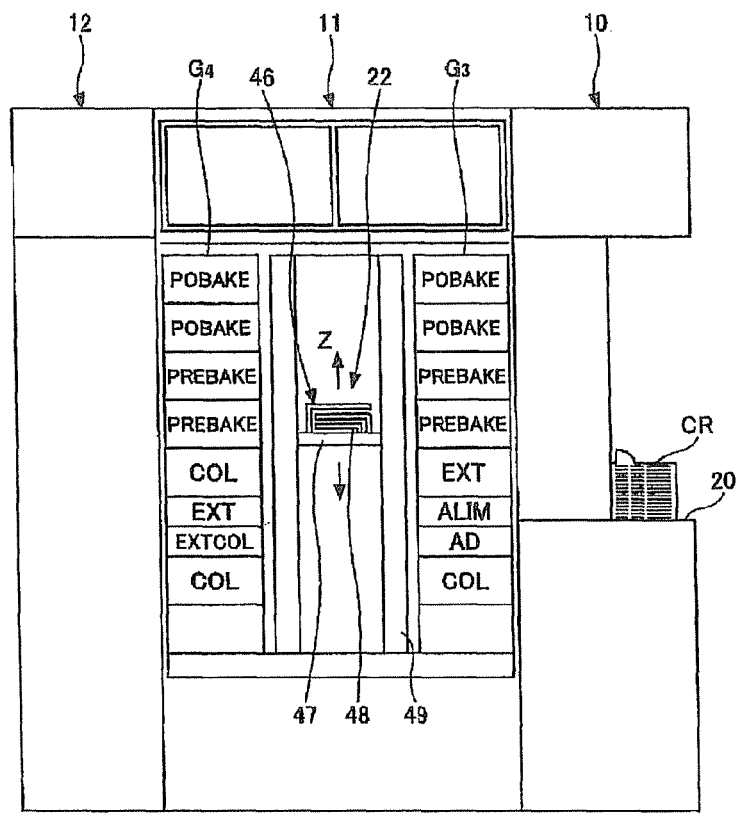
FIG. 3 is a rear view showing the overall construction of the coating/developing system of FIG. 1.

FIGS. 1 through 3 show the overall construction of a coating/developing system incorporating a resist coating apparatus for use in carrying out a resist coating method according to an embodiment of the present invention, FIG. 1 being a plan view, FIG. 2 being a front view and FIG. 3 being a rear view.

The resist coating method of this embodiment falls within the scope of a coating method according to the present invention.

As shown in FIG. 1, the coating/developing system 1 includes a cassette station 10 for carrying a number of wafers W as substrates, e.g. 25 wafers in one lot, in a wafer cassette CR into or out of the system, and for carrying a wafer W into or out of the wafer cassette CR, a processing station 11 in which various one-by-one processing units, each for carrying out certain processing of a wafer W in a one-by-one manner in a coating/developing process, are arranged in multiple stages at predetermined positions, and an interface section 12 for transferring a wafer W between the processing station 11 and an adjacent exposure apparatus (not shown).

In the cassette station 10, as shown in FIG. 1, a plurality of, for example, four, wafer cassettes CR are placed on a cassette stage 20 at the positions of positioning protrusions 20a and in a line in the X direction with a wafer entrance of each wafer cassette CR facing the processing station 11. A wafer transporter 21, which is movable in the cassette arrangement direction (X direction) and in the direction of arrangement of wafers housed in each wafer cassette CR (Z direction: vertical direction), selectively approaches each wafer cassette CR.

The wafer transporter 21 is configured to be rotatable in the θ direction. The wafer transporter 21 can also approach an alignment unit (ALIM) and an extension unit (EXT), both belonging to the multi-stage units of a third processing unit group G3 provided in the processing station 11, as will be described later.

As shown in FIG. 1, a vertical transport-type main wafer transport mechanism 22 is provided in the processing station 11, and all the processing units, including units in a single or a plurality of pairs, are disposed in multiple stages around the main wafer transport mechanism 22.

As shown in FIG. 3, the main wafer transport mechanism 22 includes, inside a cylindrical support 49, a wafer transport device 46 which is movable vertically (Z direction). The cylindrical support 49 is connected to the rotating shaft of a motor (not shown), so that by the rotational driving force of the motor, the cylindrical support 49 can be rotated about the rotating shaft together with the wafer transport device 46, whereby the wafer transport device 46 can be rotated in the θ direction. It is also possible to connect the cylindrical support 49 to a different rotating shaft (not shown) rotated by the motor.

The wafer transport device 46 has a plurality of holding members 48 which can move back and forth on a transport base 47; and a wafer W can be transferred between processing units by means of the holding members 48.

As shown in FIG. 1, five processing unit groups G1, G2, G3, G4, G5 are disposed in the processing section 11. The multi-stage units of the first and second processing unit groups G1, G2 are disposed on the front side of the system (lower side in FIG. 1). The multi-stage units of the third processing unit group G3 are disposed adjacent to the cassette station 10. The multi-stage units of the fourth processing unit group G4 can be disposed adjacent to the interface section 12. The multi-stage units of the fifth processing unit group G5 are disposed on the rear side of the system.

As shown in FIG. 2, in the first processing unit group G1, two spinner-type processing units each for carrying out certain processing of a wafer W, held on a spin chuck, in a cup CP, such as a lower resist coating unit COT and an upper developing unit DEV, are arranged in two stages. Also in the second processing unit group G2, two spinner-type processing units, such as a lower resist coating unit COT and an upper developing unit DEV, are arranged in two stages. Because discharge of a liquid resist waste is troublesome mechanically and in terms of maintenance, these resist coating units COT are preferably disposed in a low position. However, it is of course possible to dispose a COT in a high position as needed.

As shown in FIGS. 1 and 3, in the third processing unit group G3, open-type processing units each for carrying out certain processing of a wafer W placed on a stage, such as a cooling unit COL for cooling the wafer, an adhesion unit AD for carrying out so-called hydrophobizing treatment of the wafer to enhance adhesion of a resist, an alignment unit ALIM for alignment of the wafer, an extension unit EXT, a pre-baking unit PREBAKE for carrying out pre-exposure heat treatment of the wafer and a post-baking unit POBAKE for carrying out post-exposure heat treatment of the wafer, arranged in this order from the lowermost unit, are arranged e.g. in eight stages.

Also in the fourth processing unit group G4, open-type processing units, such as a cooling unit COL, an extension cleaning unit EXTCOL, an extension unit EXT, a cleaning unit COL, a pre-baking unit PREBAKE and a post-baking unit POBAKE, arranged in this order from the lowermost unit, are arranged e.g. in eight stages.

By thus disposing the cooling unit COL and the extension cleaning unit EXTCOL, which use a low processing temperature, in low positions and disposing the pre-baking unit PREBAKE and the post-baking unit POBAKE, which use a high processing temperature, in high positions, mutual thermal interference between the units can be reduced. However, random multi-stage arrangement of the units is of course possible.

As shown in FIG. 1, the interface section 12 has the same size as the processing station 11 in the depth direction (X direction), but has a smaller size in the width direction (Y direction). The interface section 12, on its front side, is provided with a portable pickup cassette CR and a fixed buffer cassette BR, arranged in two stages, and, on its rear side, is provided with a wafer periphery exposure device 23. Further, a wafer transporter 24 is provided in the center of the interface section 12. The wafer transporter 24 moves in the X direction and in the Z direction to approach the cassettes CR, BR and the wafer periphery exposure device 23. The wafer transporter 24 is also configured to be rotatable in the θ direction. The wafer transporter 24 can also approach the extension unit EXT, belonging to the multi-stage units of the fourth processing unit group G4 provided in the processing station 11, and a wafer transfer stage (not shown) provided in the adjacent exposure device.

In the coating/developing system 1, as shown in FIG. 1, the multi-stage units of the fifth processing unit group G5 shown by the broken lines can be disposed at the rear of the main wafer transport mechanism 22. The multi-stage units of the fifth processing unit group G5 can be moved along guide rails 25 laterally as viewed from the main wafer transport mechanism 22. Accordingly, even when the multi-stage units of the fifth processing unit group G5 are provided as shown, a space can be ensured behind the main wafer transport mechanism 22 by moving the unit group G5 along the guide rails 25. This enables maintenance works to be performed easily from behind the main wafer transport mechanism 22. Instead of linearly moving the multi-stage units of the fifth processing unit group G5 along the guide rails 25, it is also possible to pivot the unit group G5 to the outside of the system as shown by the chain line arrow in FIG. 1. This can also ensure a space for maintenance works for the main wafer transport mechanism 22.

Figure 4:
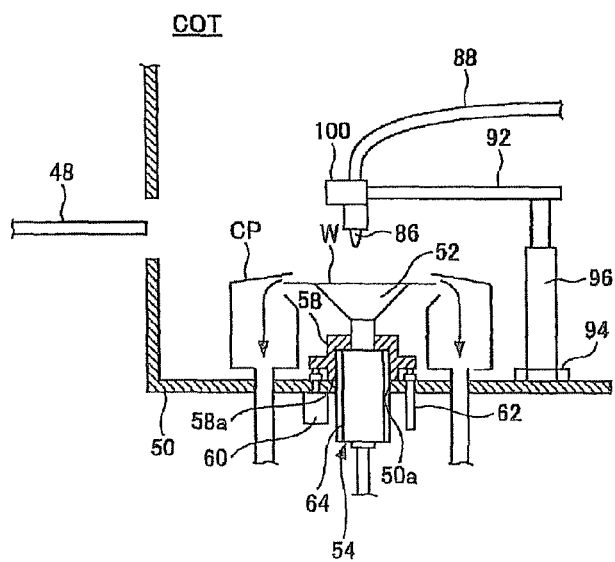
FIG. 4 is a cross-sectional view of a resist coating unit COT for carrying out the resist coating method according to the embodiment of the present invention.
Figure 5:
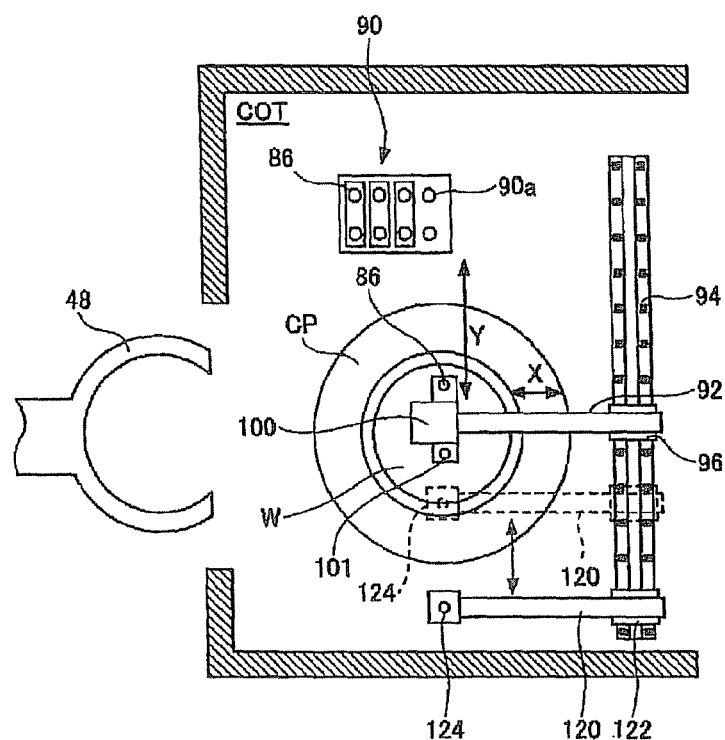
FIG. 5 is a plan view of the resist coating unit COT of FIG. 4.

A description will now be given of the resist coating unit COT for carrying out a resist coating method according to an embodiment of the present invention. FIGS. 4 and 5 are a cross-sectional view and a plan view, respectively, showing the resist coating unit COT.

An annular cup CP is disposed centrally in the resist coating unit COT, and a spin chuck 52 is disposed inside the cup CP. The spin chuck 52, while fixing and holding a wafer W thereon by vacuum attraction, is rotationally driven by a drive motor 54. The drive motor 54 is vertically movably disposed in an opening 50a formed in a unit bottom plate 50, and is coupled via a cap-shaped flange member 58, e.g. made of aluminum, to a lifting drive means 60, such as an air cylinder, and a lifting guide means 62. A cylindrical cooling jacket 64, e.g. made of SUS, is mounted to the side surface of the drive motor 54. The flange member 58 is mounted such that it covers the upper half of the cooling jacket 64.

When carrying out resist coating, the lower end 58a of the flange member 58 is brought into close contact with the unit bottom plate 50 around the periphery of the opening 50a, whereby the unit is hermetically closed. When transferring a wafer W between the spin chuck 52 and the holding members 48 of the main wafer transport mechanism 22, the lifting drive means 60 lifts up the drive motor 54 and the spin chuck 52, whereby the lower end of the flange member 58 lifts off the unit bottom plate 50.

A resist nozzle 86 for supplying a liquid resist to the surface of a wafer W is connected via a resist supply pipe 88 to the below-described resist supply section. The resist nozzle 86 is detachably mounted via a nozzle holder 100 to the front end of a resist nozzle scan arm 92. The resist nozzle scan arm 92 is mounted to the upper end of a vertical support member 96 which is horizontally movable on guide rails 94 that run in one direction (Y direction) on the unit bottom plate 50, and moves in the Y direction together with the vertical support member 96 by means of a not-shown Y direction drive mechanism. The resist nozzle according to this embodiment corresponds to a nozzle according to the present invention (this holds also for the nozzle according to the below-described variation).

In order to selectively mount the resist nozzle 86 to the resist nozzle scan arm 92 in a resist nozzle standby section 90, as shown in FIG. 5, the resist nozzle scan arm 92 can be moved also in the X direction perpendicular to the Y direction by means of a not-shown X direction drive mechanism.

In the resist nozzle standby section 90, the orifice of the resist nozzle 86 is inserted into a mouse 90a of a solvent atmosphere chamber and exposed to a solvent atmosphere in the mouse 90a so that a liquid resist at the nozzle tip will not solidify or deteriorate. The resist nozzle standby section 90 is provided with a plurality of resist nozzles 86 so that the nozzles can be selectively used depending on e.g. the type of the liquid resist used.

To the front end (nozzle holder 100) of the resist nozzle scan arm 92 is mounted a solvent nozzle 101 for supplying a solvent for wetting a wafer surface, such as a thinner, to the wafer surface prior to the supply of a liquid resist to the wafer surface. The solvent nozzle 101 is connected via a not-shown solvent supply pipe to the below-described solvent supply section. The solvent nozzle 101 and the resist nozzle 86 are mounted to the resist nozzle scan arm 92 such that their orifices lie on a line extending along the Y movement direction of the resist nozzle scan arm 92.

Besides the vertical support member 96 which supports the resist nozzle scan arm 92, a vertical support member 122 which supports a rinse nozzle scan arm 120 and is movable in the Y direction is provided on the guide rails 94. The rinse nozzle scan arm 120 and a rinse nozzle 124 make a translational or linear movement by means of a Y direction drive mechanism (not shown) between a rinse nozzle standby position (position shown by the solid lines) lateral to the cup CP and a rinse liquid discharge position (position shown by the dashed lines) right above a peripheral portion of a wafer W held on the spin chuck 52.

Figure 6:
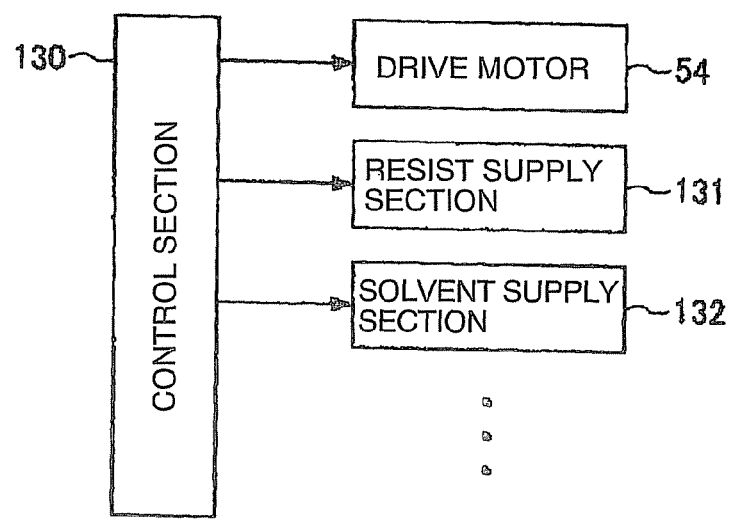
FIG. 6 is a diagram showing the construction of the control system of the resist coating unit COT.

FIG. 6 is a diagram showing the construction of the control system of the resist coating unit COT.

The control system 130 is to control various components of the resist coating unit COT. For example, the control system 130 controls the drive motor 54, a resist supply section 131, a solvent supply section 132, etc. In particular, the control section 130 controls the rotating speed of the drive motor 54 in several steps, for example, four steps during resist coating (five steps including one during the supply of a thinner) as described later. Further, the control section 130 controls the supply of a liquid resist from the resist supply section 131 to the resist nozzle 86 and the supply of a solvent, such as a thinner, from the solvent supply section 132 to the solvent nozzle 101.

Figure 7A:
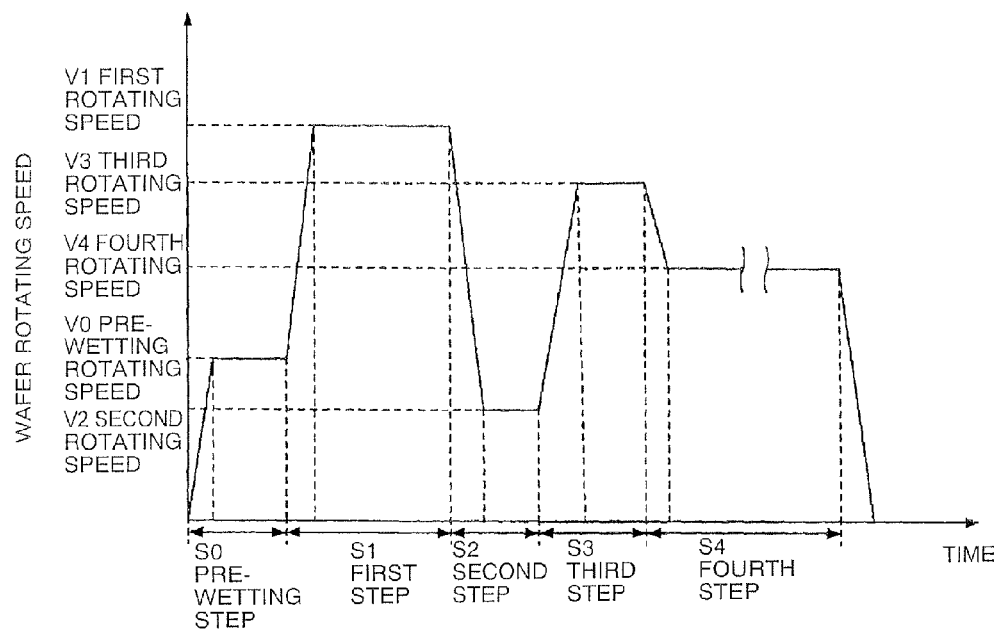
FIG. 7A is a graph showing rotational control of the resist coating unit in the resist coating method according to the embodiment of the present invention.
Figure 7B:
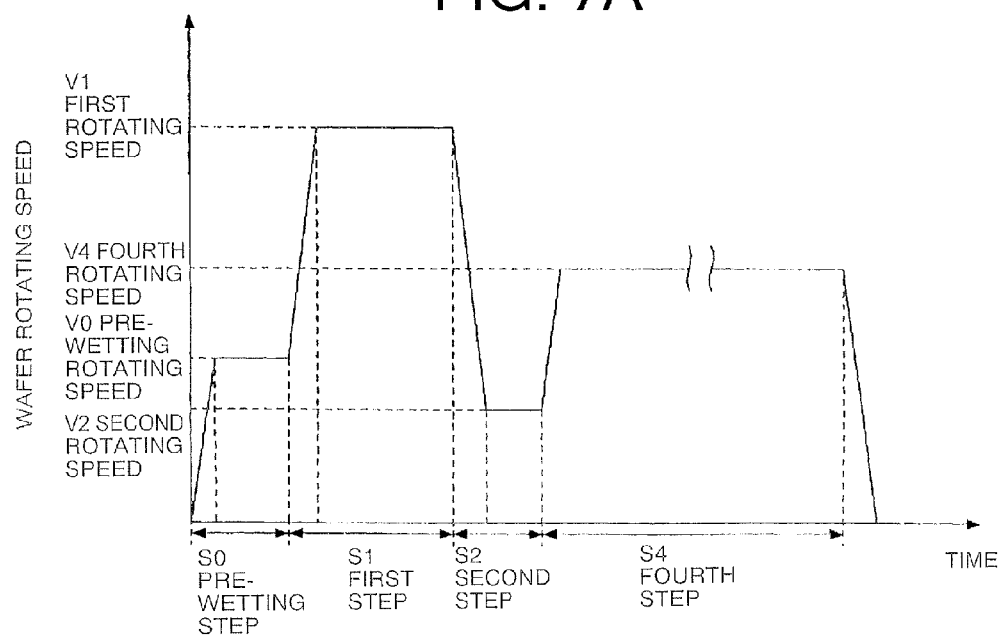
FIG. 7B is a graph showing rotational control of the resist coating unit in a conventional resist coating method.

The resist coating operation of the resist coating unit COT in carrying out a resist coating method according to this embodiment will now be described with reference to FIGS. 4, 5, 7 and 8. FIG. 7A is a graph showing rotational control of the resist coating unit in the resist coating method of this embodiment, and FIG. 7B is a graph showing rotational control of the resist coating unit in a conventional resist coating method. FIGS. 8A through 8D are plan views illustrating the state of a liquid resist on a wafer during the process of the resist coating method of this embodiment. For the purpose of facilitating technical understanding, the length of time of each step shown in FIGS. 7A and 7B does not exactly represent the actual length of time. Similarly, the rotating speed shown in FIGS. 7A and 7B does not exactly represent the actual rotating speed.

As shown in FIG. 4, a wafer W is transported by the holding members 48 of the main wafer transport mechanism 22 to right above the cup CP of the resist coating unit COT. The wafer W is then vacuum-attracted to the spin chuck 52 which has been raised by the lifting drive means 60, such as an air cylinder, and the lifting guide means 62. Thereafter, the main wafer transport mechanism 22 withdraws the holding members 48 from the resist coating unit COT, thereby completing transfer of the wafer W to the resist coating unit COT.

Next, the spin chuck 52 is lowered until the wafer W reaches a predetermined position in the cup CP, and the drive motor 54 starts rotational driving of the spin chuck 52.

Next, the movement of the nozzle holder 100 from the resist nozzle standby section 90 is started. The nozzle holder 100 is moved in the Y direction.

After the orifice of the solvent nozzle 101 has reached a position above the center of the spin chuck 52 (center of the wafer W), a solvent such as a thinner is supplied to the surface of the rotating wafer W. The solvent supplied to the wafer surface evenly spreads outwardly from the wafer center by centrifugal force.

Next, the nozzle holder 100 is moved in the Y direction until the orifice of the resist nozzle 86 reaches a position above the center of the spin chuck 52 (center of the wafer W). A liquid resist PR is then dropped from the orifice of the resist nozzle 86 onto the center of the surface of the rotating wafer W to carry out resist coating of the surface of the wafer W.

In this embodiment, the steps S0 to S4 shown in FIG. 7A are carried out while controlling the rotating speed of the wafer W (i.e. the rotating speed of the drive motor 54) and the discharge of the solvent or the liquid resist from the nozzle by the control section 130. The steps S1 to S4 shown in FIG. 7A correspond to the first to fourth steps according to the present invention. FIGS. 8A through 8D each illustrate the state of the liquid resist PR on the wafer W after the completion of each of the steps S1 to S4.

Firstly, a pre-wetting step, the step S0 shown in FIG. 7A, is carried out. The pre-wetting step is a step to carry out so-called pre-wetting which comprises wetting the entire front surface of the wafer W with a solvent, such as a thinner, prior to application of the liquid resist PR. More specifically, the wafer W is accelerated and rotated at a rotating speed (pre-wetting rotating speed V0) of 0 to 2000 rpm, preferably about 1000 rpm, as shown in FIG. 7A. While rotating the wafer W, a thinner is supplied from the solvent nozzle 101 to approximately the center of the wafer W e.g. for 0.1 second, thereby spreading the thinner on the wafer W radially outward and wetting the surface of the wafer W with the thinner. The pre-wetting treatment promotes spreading of the liquid resist PR on the wafer W. This enables the formation of a uniform resist film with the use of a smaller amount of liquid resist PR, and can therefore further reduce the consumption of the liquid resist PR.

Figure 8A:
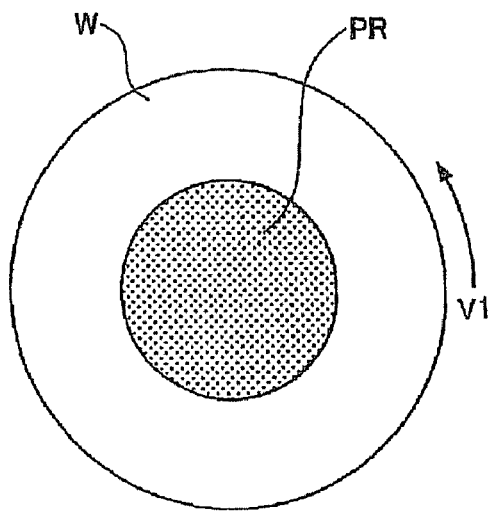
FIGS. 8A through 8D are plan views illustrating the state of a liquid resist on a wafer during the process of the resist coating method according to the embodiment of the present invention.

Next, a first step, the step S1 shown in FIG. 7A, is carried out. The first step S1 comprises rotating the substrate (wafer W) at a first rotating speed V1, and supplying the liquid resist PR onto approximately the center of the rotating substrate (wafer W), thereby spreading the liquid resist PR on the substrate (wafer W) outwardly from the center. More specifically, while accelerating and rotating the wafer W at a rotating speed (first rotating speed V1) of 2000 to 4000 rpm, preferably about 2500 rpm, as shown in S1 of FIG. 7A, the liquid resist PR is supplied from the resist nozzle 86 onto approximately the center of the wafer W e.g. for 1.5 seconds, thereby spreading the liquid resist PR on the wafer W radially outward and coating the wafer surface with the liquid resist PR. FIG. 8A is a plan view illustrating the state of the wafer W after the first step S1 is carried out.

The amount of the liquid resist PR supplied in the first step S1 is about half of such an amount that the periphery of the liquid resist PR, supplied in that amount and spreading on the wafer W radially outward, will reach to the periphery of the wafer W at the above-described rotating speed. More specifically, the amount of the liquid resist supplied to the center of the surface of the wafer W in the first step S1 is, for example, 0.5 ml, which is half of the conventional amount 1.0 ml. Accordingly, as shown in FIG. 8A, the periphery of the liquid resist PR, spreading on the wafer W radially outward from the center, does not reach to the periphery of the wafer W, and only reaches to e.g. a position at half the distance from the center of the wafer W to the periphery.

Figure 8C:
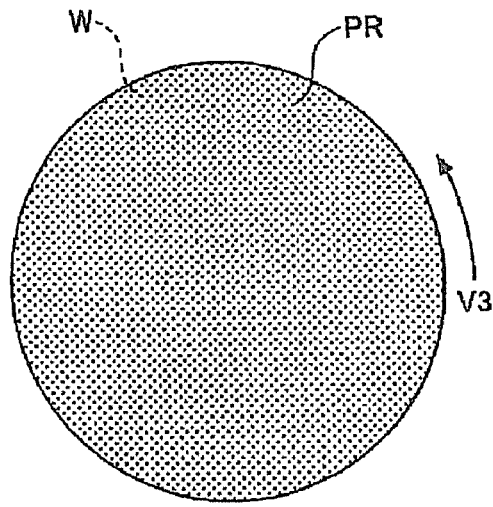
Figure 8B:
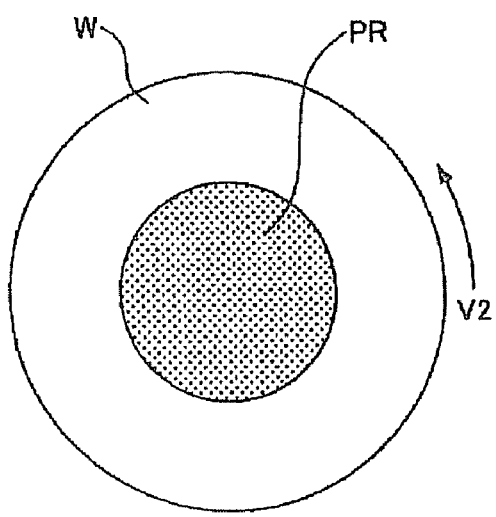

Next, a second step, the step S2 shown in FIG. 7A, is carried out after the first step S1. The second step S2 comprises rotating the substrate (wafer W) at a second rotating speed V2 which is lower than the first rotating speed V1, thereby reshaping the spread liquid resist PR. More specifically, the wafer W is decelerated and rotated at a rotating speed (second rotating speed V2) of 50 to 2000 rpm, preferably about 100 rpm, as shown in S2 of FIG. 7A. The second step S2 is preferably carried out e.g. for about 1.0 second. FIG. 8B is a plan view illustrating the state of the wafer W after the second step S2 is carried out.

As shown in FIG. 8B, the periphery of the liquid resist PR, which has not reached to the periphery of the wafer W and only reached to e.g. the midpoint between the center and the periphery of the wafer W in the first step S1, remains in approximately the same position as in the first step S1 during the second step S2. Further, during the second step S2, the spread liquid resist PR accumulates in its periphery and the thickness of the periphery increases, whereby the liquid resist PR is reshaped, as will be described later.

Next, a third step, the step S3 shown in FIG. 7A, is carried out after the second step S2. The third step S3 comprises rotating the substrate (wafer W) at a third rotating speed V3 which is higher than the second rotating speed V2, thereby further spreading the reshaped liquid resist PR on the substrate (wafer W) radially outward. More specifically, the wafer W is accelerated and rotated at a rotating speed (third rotating speed V3) of 1000 to 4000 rpm, preferably about 1500 rpm, as shown in S3 of FIG. 7A, to cause the liquid resist PR, which has spread e.g. to the midpoint between the center and the periphery of the wafer W, to further spread radially outward on the wafer W. The third step S3 is preferably carried out e.g. for about 2.5 seconds. FIG. 8C is a plan view illustrating the state of the wafer W after the third step S3 is carried out.

As shown in FIG. 8C, the periphery of the liquid resist PR, spreading radially outward on the wafer W, reaches to approximately the periphery of the wafer W in the third step S3. In order for the liquid resist PR not to lose its fluidity during the third step S3, the third step S3 is preferably carried out for a short time of less than 3 seconds. That is, the liquid resist PR loses its fluidity in the course of a fourth step S4 carried out after the third step S3.

Figure 8D:
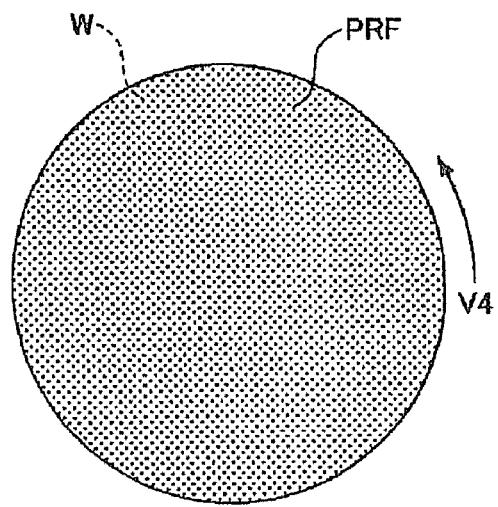

Next, the fourth step, the step S4 shown in FIG. 7A, is carried out after the third step S3. The fourth step S4 comprises rotating the substrate (wafer W) at a fourth rotating speed V4 which is higher than the second rotating speed V2 and lower than the third rotating speed V3, thereby forcing the liquid resist PR out of the substrate (wafer W) and drying the liquid resist PR on the substrate (wafer W). The fourth rotating speed V4 may be made lower than the first rotating speed V1. More specifically, the wafer W is decelerated and rotated at a rotating speed (fourth rotating speed V4) which is in the range of 1000 to 2000 rpm and which provides a desired film thickness, as shown in FIG. 7A, to force the liquid resist PR out of the wafer W and to thereby dry the liquid resist PR on the wafer W. The fourth step S4 is carried out e.g. for 30 seconds. FIG. 8D is a plan view illustrating the state of the wafer W after the fourth step S4 is carried out.

As described above, in the first step S1 the wafer W is rotated at the first rotating speed V1, which is a relatively high speed such as, for example, about 2500 rpm while supplying the liquid resist PR to the wafer W. This, together with the pre-wetting treatment, can extend or spread the liquid resist PR macroscopically uniformly on the surface of the wafer W.

In the second step S2 and the third step S3, the wafer W is rotated at the second rotating speed V2 which is lower than the first rotating speed V1, and subsequently the wafer W is rotated at the third rotating speed V3 which is higher than the second rotating speed V2. This makes it possible to extend or spread the liquid resist PR microscopically uniformly over the entire surface of the wafer W upon the draining/drying of the liquid resist PR in the fourth step S4. Further, the liquid resist, even in a smaller amount than conventional one, can be efficiently applied to the entire wafer surface. The consumption of the liquid resist in the resist coating process can thus be reduced.

A description will now be given of the advantages of the resist coating method of this embodiment, i.e. the advantage that a liquid resist PR can be extended or spread microscopically uniformly over the entire surface of a wafer W upon the draining/drying of the liquid resist PR in the fourth step S4, and the advantage that the liquid resist, even in a smaller amount than conventional one, can be efficiently applied to the entire wafer surface, and therefore the consumption of the liquid resist in the resist coating process can be reduced.

A description is first given of the advantage that a liquid resist PR can be extended or spread microscopically uniformly over the entire surface of a wafer W upon the draining/drying of the liquid resist in the fourth step S4.

Consider now the case where a wafer W has a three-dimensional surface pattern, like a wafer W having a surface film in a circuit pattern. In this case, if the wafer W is rotated, during draining/drying of the liquid resist, at a rotating speed which is equal to or higher than a rotating speed (first rotating speed V1) during application of a liquid resist as in a conventional method, the liquid resist, spreading on the wafer W radially outward by centrifugal force, will not fully enter the grooves of the three-dimensional pattern, resulting in the formation of a resist film which is thinner in the grooves than in the other portion.

According to the resist coating method of this embodiment, on the other hand, the wafer W is rotated, during draining/drying of the liquid resist, at a rotating speed (second rotating speed V2) which is lower than the rotating speed (first rotating speed V1) during application of the liquid resist. This allows the liquid resist, spreading on the wafer W radially outward, to uniformly enter the grooves of the three-dimensional pattern, thus allowing the liquid resist to spread uniformly over the surface of the wafer W.

Thus, according to the resist coating method of this embodiment, a resist film can be formed uniformly both macroscopically and microscopically on the surface of a wafer W having a three-dimensional pattern in the surface.

Next, a description is given of the advantage that the liquid resist PR in a smaller amount can be efficiently applied to the entire surface of the wafer W, and therefore the consumption of the liquid resist PR can be reduced. In the following description, reference is made to FIGS. 8 and 9 and to comparison of FIG. 7A illustrating the resist coating method of this embodiment with FIG. 7B illustrating a conventional resist coating method. FIGS. 9A through 9D are cross-sectional views illustrating the state of the liquid resist on the wafer in the first to fourth steps, respectively, of the process of the resist coating method according to this embodiment.

Figure 9A:
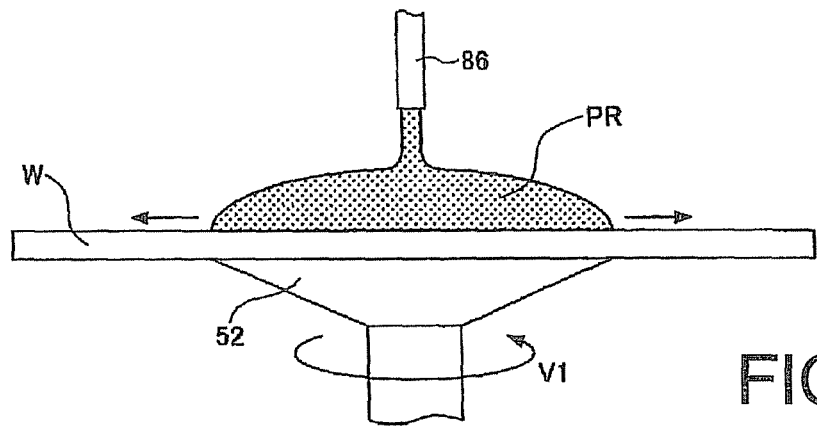
FIGS. 9A through 9D are cross-sectional views illustrating the state of a liquid resist on a wafer during the process of the resist coating method according to the embodiment of the present invention.

The state of the liquid resist PR in the first step S1 is described first. FIG. 9A illustrates the state of the liquid resist PR on the wafer W in the first step S1. In the first step S1, the liquid resist PR is supplied onto the center of the surface of the wafer W and the liquid resist PR supplied is caused to spread on the wafer W radially outward. The surface of the wafer W has undergone the pre-wetting treatment with a solvent to promote spreading of the liquid resist PR in the first step S1. In addition, the liquid resist PR has been adjusted to decrease the surface tension to some degree. Therefore, the lower side of the liquid resist PR, in contact with the wafer W, first spreads on the wafer W radially outward, while the upper or surface side of the liquid resist PR late spreads radially outward. Accordingly, as shown in FIG. 9A, the liquid resist PR has a cross-sectional shape whose thickness decreases with distance from the center.

Figure 9B:
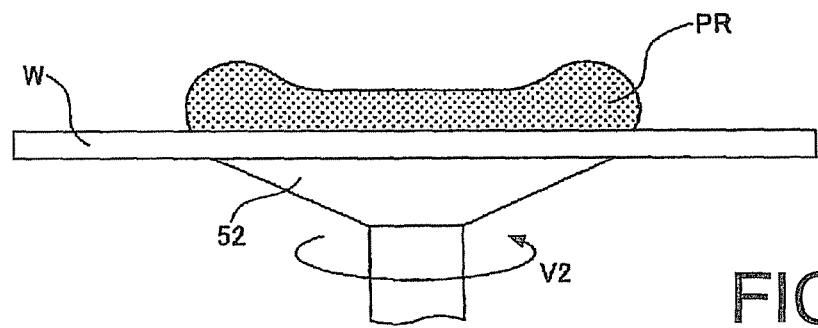

Next, the state of the liquid resist PR in the second step S2 is described. FIG. 9B illustrates the state of the liquid resist PR on the wafer W in the second step S2. In the second step S2, the wafer W is decelerated to the second rotating speed V2 which is lower than the first rotating speed V1, and the wafer W is rotated at the second rotating speed V2. Accordingly, the centrifugal force that acts on the liquid resist PR in the second step S2 is smaller than the centrifugal force that acts on the liquid resist PR in the first step S1. The radially outward diffusion of the liquid resist PR on the wafer W therefore stops on its lower side in contact with the wafer W. The upper or surface side of the liquid resist PR, on the other hand, has smaller viscosity and thus still has fluidity, and therefore continues to spread radially outward on the wafer W by inertia even when the centrifugal force has become smaller. Accordingly, the liquid resist PR comes to take a cross-sectional shape as shown in FIG. 9B: the liquid resist is accumulated in the peripheral upper or surface portion of the entire liquid resist PR and the liquid resist PR has a maximum thickness in the vicinity of its periphery.

Figure 9C:
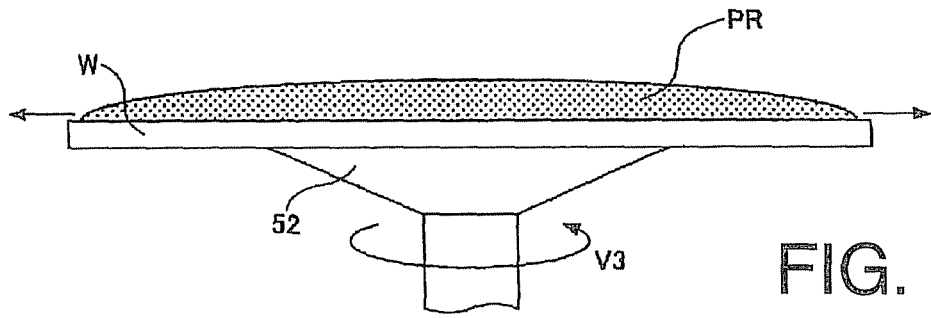

Next, the state of the liquid resist PR in the third step S3 is described. FIG. 9C illustrates the state of the liquid resist PR on the wafer W in the third step S3. In the third step S3, the substrate (wafer W) is rotated at the third rotating speed V3 which is higher than the second rotating speed V2, thereby further spreading the reshaped liquid resist PR radially outward on the substrate (wafer W). As described above, the thickness of the liquid resist PR, in the vicinity of its periphery, has become maximum in the second step S2 and larger than that in the first step S1. Thus, the mass of the liquid resist PR has increased in its peripheral portion. Centrifugal force that acts on a body is proportional to the mass of the body, to the radius of rotation of the body and to the square of the rotating speed of the body. Accordingly, due to the increase in the mass of the peripheral portion of the liquid resist, the peripheral portion is subjected to a larger centrifugal force at the third rotating speed V3 than that applied in the first step S1 at the first rotating speed V1 even when the third rotating speed V3 is approximately equal to the first rotating speed V1. Consequently, despite no change in the overall amount of the liquid, resist PR, the liquid resist PR can be further spread radially outward on the wafer W near to its periphery. When the third rotating speed V3 is higher than the first rotating speed V1, the liquid resist PR can be further spread radially outward on the wafer W more easily in the third step S3. Even when the third rotating speed V3 is lower than the first rotating speed V1, the liquid resist PR can be further spread radially outward on the wafer W due to the above-described reshaping of the liquid resist PR. Thus, the liquid resist PR spreads over the entire surface of the wafer W and comes to take a cross-sectional shape whose thickness decreases with distance from the center as shown in FIG. 9C.

With reference to the state of the liquid resist PR on the wafer W in each step, the liquid resist PR can, in some cases, have a cross-sectional shape different from those shown in FIGS. 9A through 9D, depending on the surface tension of the liquid resist, the wetting of the liquid resist on the substrate surface, the viscosity of the liquid resist, the density of the liquid resist, etc. For example, in the case where the liquid resist PR has a large surface tension, poor wetting on the substrate surface, low viscosity and low density, the liquid resist PR can have a cross-sectional shape, having a maximum thickness in the vicinity of its periphery, in the first step S1, have a cross-sectional shape whose thickness decreases with distance from the center in the second step S2, and again have a cross-sectional shape, having a maximum thickness in the vicinity of its periphery, in the third step S3. There is a case in which spreading of the liquid resist PR is blocked by a micro protrusion on the surface of the wafer W in the first step S1 and the liquid resist PR is pulled back from the position of the micro protrusion in the second step S2, but in the third step S3 the liquid resist PR is again forced outward and caused to pass across the micro protrusion and further spread radially outward on the wafer W. In this case, the thickness of the liquid resist PR in its periphery and the thickness in its center in the first step S1 to the third step S3 have an approximately inverse relationship to that shown in FIGS. 9A through 9C. Also in this case, the liquid resist PR further spreads radially outward on the wafer W in the third step S3 as shown in FIGS. 8A through 8C.

According to the resist coating method of this embodiment, the above-described technical effects can be achieved by carrying out the first step of rotating the wafer W at the first rotating speed V1 while supplying the liquid resist PR to the wafer W, thereby spreading the liquid resist PR radially outward on the wafer W, carrying out the second step S2 of rotating the wafer W at the second rotating speed V2 which is lower than the first rotating speed V1, thereby reshaping the liquid resist PR, and then carrying out the third step of rotating the wafer W at the third rotating speed V3 which is higher than the second rotating speed V2. Thus, the advantageous effect of reducing the consumption of the resist, obtained by the resist coating method of this embodiment, cannot be obtained by carrying out the third step directly after the first step without carrying out the second step.

Figure 9D:
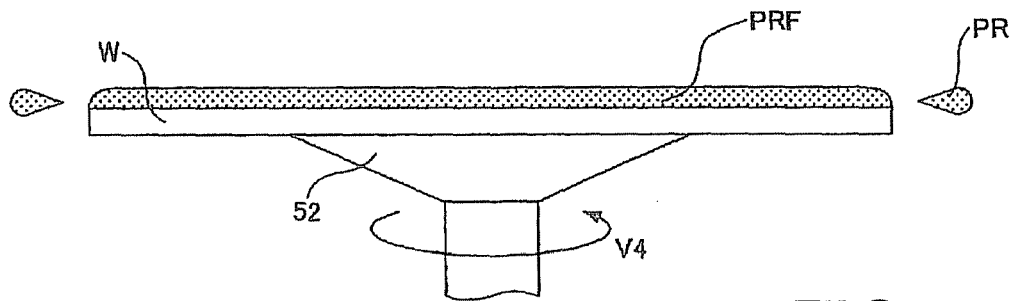

Lastly, the state of the liquid resist PR in the fourth step S4 is described. FIG. 9D illustrates the state of the liquid resist PR on the wafer W in the fourth step S4. In the fourth step S4, the substrate (wafer W) is rotated at the fourth rotating speed V4 which is higher than the second rotating speed V2 and lower than the third rotating speed V3, thereby forcing an excess or unnecessary liquid resist PR out of the substrate (wafer W). By the operation, the liquid resist PR is dried and caused to lose its fluidity while it is brought into a predetermined thickness by a balance between centrifugal force due to the rotation of the substrate (wafer W) and the fluidity of the liquid resist PR determined by its viscosity. A resist film PRF having the predetermined thickness is thus formed. As shown in FIG. 9D, the resist film PRF has a cross-sectional shape whose thickness is constant from the center to the periphery.

On the other hand, the conventional coating method does not include the third step S3 of the resist coating method of this embodiment, as shown in FIG. 7B: The fourth step S4 is carried out directly after the second step S2. Also in the conventional resist coating method, as with the resist coating method of this embodiment, the liquid resist PR supplied to the surface of the wafer W is spread radially outward on the wafer W in the first step S1, whereas the liquid resist PR is not spread radially outward on the wafer W in the second step S2.

In the conventional coating method, because of no inclusion of the third step S3, the liquid resist PR which has been spread on the wafer W in the first step S1, cannot be further spread radially outward on the wafer W. The periphery of the liquid resist PR must therefore be caused to reach to the periphery of the wafer W in the first step S1. Accordingly, the liquid resist PR must be supplied in an amount necessary to reach to the periphery of the wafer W. Thus, the amount of the liquid resist PR supplied in the first step S1 should necessarily be larger compared to the coating method according to the present invention.

According to the resist coating method of this embodiment, a liquid resist in a smaller amount can be efficiently applied to the entire surface of a substrate (wafer) by carrying out, after the second step S2, the third step S3 of rotating the substrate (wafer) at the third rotating speed V3 which is higher than the second rotating speed V2. Consequently, the consumption of the liquid resist in the coating of the substrate (wafer) with the resist can be reduced.

Variation of this Embodiment

A resist coating method according to a variation of this embodiment will now be described with reference to FIGS. 10 through 13.

The resist coating method of this variation differs from the resist coating method of the above-described embodiment in that in the first step the rotating speed of a substrate is gradually increased so that it comes to the first rotating speed.

The resist coating method of this variation also falls within the scope of a coating method according to the present invention.

Figure 10:
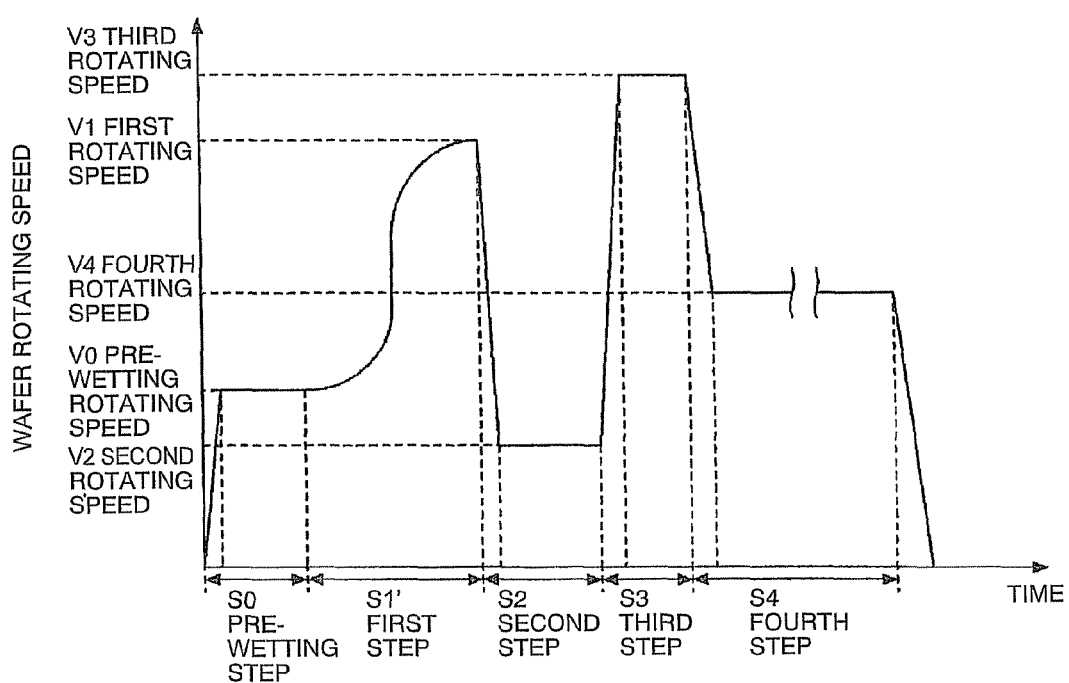
FIG. 10 is a graph showing rotational control of the resist coating unit in a resist coating method according to a variation of the embodiment of the present invention.
Figure 11A:
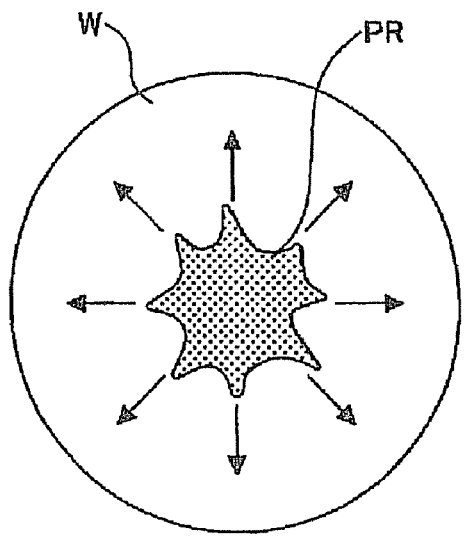
FIG. 11A is a plan view illustrating the state of a liquid resist on a wafer in a resist coating process in which the wafer is rotated at a high speed from the start of the first step.
Figure 11B:
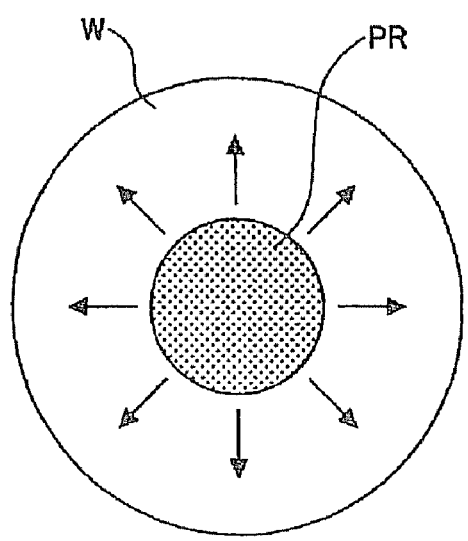
FIG. 11B is a plan views illustrating the state of a liquid resist on a wafer in a resist coating process according to the variation of the present invention.
Figure 12:
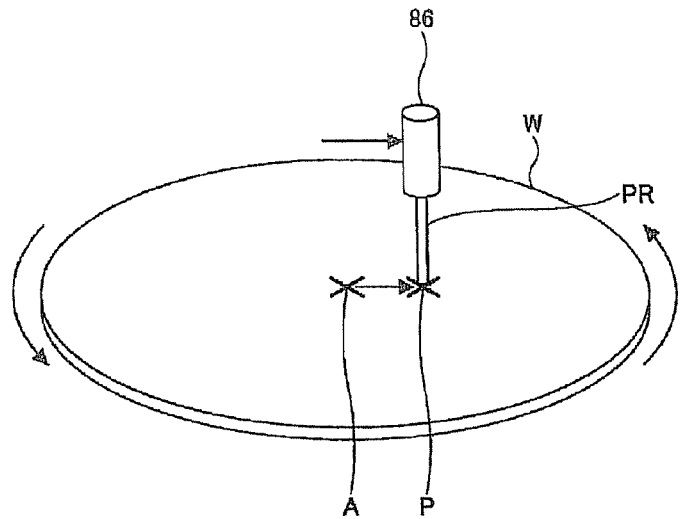
FIG. 12 is a diagram illustrating movement of a nozzle to displace the liquid resist supply position on a wafer from approximately the center of the wafer.
Figure 13:
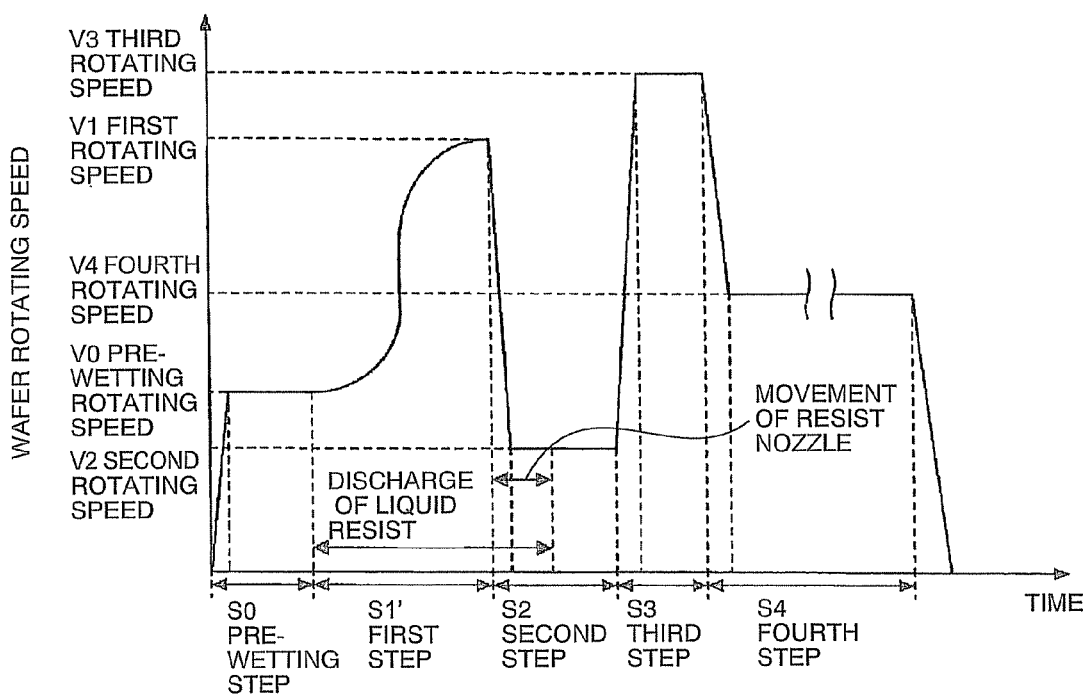
FIG. 13 is a graph illustrating rotational control of the resist coating unit in the case where the liquid resist supply position on a wafer is displaced.

FIG. 10 is a graph showing rotational control of the resist coating unit in the resist coating method according to this variation. FIGS. 11A and 11B are plan views, illustrating the state of a liquid resist on a wafer during the process of the resist coating method according to this variation. FIG. 12 is a diagram illustrating movement of the nozzle to displace the liquid resist supply position on a wafer from approximately the center of the wafer. FIG. 13 is a graph illustrating rotational control of the resist coating unit in the case where the liquid resist supply position on a wafer is displaced.

As with FIGS. 7A and 7B, for the purpose of facilitating technical understanding, the length of time of each step shown in FIG. 10 does not exactly represent the actual length of time. Similarly, the rotating speed shown in FIG. 10 does not exactly represent the actual rotating speed.

In the following description, the same terms or items as described above are given the same reference numerals and a description thereof may be omitted.

A coating/developing system incorporating a resist coating apparatus (unit) for use in carrying out the resist coating method of this variation may have the same construction as the coating/developing system, shown in FIGS. 1 through 3, described above with reference to the above-described embodiment. A resist coating unit for carrying out the resist coating method of this variation may have the same construction as the resist coating unit COT, shown in FIGS. 4 through 6, described above with reference to the above-described embodiment.

On the other hand, the resist coating operation of the resist coating unit COT in carrying out the resist coating method of this variation differs from the operation in the above-described embodiment.

In this variation, the steps S0, S1' and S2 to S4 shown in FIG. 10 are carried out under control of the rotating speed of a wafer W (i.e. the rotating speed of the drive motor 54) and the discharge of a solvent or a liquid resist from the nozzle by the control section 130 (the steps S1', S2 to S4 shown in FIG. 10 also correspond to the first to fourth steps according to the present invention). The step S1' shown in FIG. 10 in this variation differs from the step S1 shown in FIG. 7A in the above-described embodiment.

In this variation, a pre-wetting step, the step S0 shown in FIG. 10, is a step to carry out pre-wetting which comprises wetting the entire front surface of a wafer W with a solvent, such as a thinner, prior to application of a liquid resist PR. The pre-wetting step in this variation can be carried out in the same manner as in the step S0 of the above-described embodiment, shown in FIG. 7A. The pre-setting rotating speed V0 in the pre-wetting step corresponds to the fifth rotating speed according to the present invention.

Next, a first step, the step S1' shown in FIG. 10, is carried out. The first step S1' comprises accelerating the rotation of the wafer W from the pre-wetting rotating speed V0 to a first rotating speed V1, and supplying a liquid resist PR onto approximately the center of the rotating wafer W, thereby spreading the liquid resist PR on the wafer W outwardly from the center. In particular, the wafer W has been rotated at the pre-wetting rotating speed V0, which is lower than the first rotating speed, until the start of the first step S1'. After the start of the first step S1', the rotating speed of the wafer W is gradually and continuously increased from the pre-wetting rotating speed V0. Further, the rotational acceleration of the wafer W is gradually decreased so that the rotating speed of the wafer W converges to (comes to) the first rotating speed V1 by the end of the first step.

In the first step S1', a not-shown valve is first opened to start discharge of the liquid resist PR from the resist nozzle 86, so that the liquid resist PR begins to be supplied to the center of the wafer W rotating at the pre-wetting rotating speed V0.

In the first step S1', the rotating speed of the wafer W is raised from the pre-wetting rotating speed V0 to a higher rotating speed (first rotating speed V1), for example, 2000 to 4000 rpm, preferably about 2500 rpm. The rotating speed of the wafer W, which is the pre-wetting rotating speed V0 at the start of the first step S1, is increased gradually and continuously. The rotational acceleration of the wafer W first increases gradually e.g. from zero. The rotational acceleration of the wafer W then turns to decrease gradually, and the rotating speed of the wafer W comes to the first rotating speed V1 e.g. at the end of the first step S1'. Thus, in the first step S1', the rotating speed of the wafer W changes from the pre-wetting rotating speed V0 to the first rotating speed V1 in an S-shaped curve as shown in FIG. 10.

Next, a second step, the step S2 shown in FIG. 10, is carried out after the first step S1'. The second step S2 comprises rotating the wafer W at a second rotating speed V2 which is lower than the first rotating speed V1, thereby reshaping the spread liquid resist PR. The second step S2 can be carried out in the same manner as in the step S2 of the above-described embodiment, shown in FIG. 7A.

Next, a third step, the step S3 shown in FIG. 10, is carried out after the second step S2. The third step S3 comprises rotating the wafer W at a third rotating speed V3 which is higher than the second rotating speed V2, thereby further spreading the reshaped liquid resist PR on the wafer W radially outward. The third step S3 can be carried out in the same manner as in the step S3 of the above-described embodiment, shown in FIG. 7A.

Next, a fourth step S4 is carried out after the third step S3. The fourth step S4 comprises rotating the wafer W at a fourth rotating speed V4 which is higher than the second rotating speed V2 and lower than the third rotating speed V3, thereby forcing the liquid resist PR out of the wafer W and drying the liquid resist PR on the wafer W. The fourth step S4 can be carried out in the same manner as in the step S4 of the above-described embodiment, shown in FIG. 7A.

According to the resist coating method of this variation, as with the above-described embodiment, the liquid resist PR can be extended or spread microscopically uniformly over the entire surface of the wafer W upon the draining/drying of the liquid resist PR in the fourth step S4. Further, as described above with reference to the above-described embodiment and to FIGS. 8 and 9, the liquid resist PR, even in a smaller amount than conventional one, can be efficiently applied to the entire surface of the wafer W, and therefore the consumption, of the liquid resist PR can be reduced.

Further, according to this variation, the rotating speed of the wafer W, which has been rotating at the pre-wetting rotating speed V0 until the start of the first step S1', is gradually and continuously increased after the start of the first step S1'. Further, the rotating acceleration of the wafer W is gradually decreased so that the rotating speed of the wafer W converges to (comes to) the first rotating speed V1 by the end of the first step S1'. This manner of operation can suppress the formation of coating streaks even when the liquid resist is applied in a further smaller amount. This can further reduce the amount of the liquid resist used and can form a thinner resist film. In addition, a further cost reduction can be achieved.

The following may be a reason why according to the coating method of this variation, the formation of coating streaks can be suppressed even when a liquid resist is applied in a small amount.

If the rotating speed of the wafer W is raised rapidly in the first step so as to rotate the wafer W at the high rotating speed V1 from the start of the first step, a strong centrifugal force acts on the liquid resist PR immediately after it is supplied to the center of the wafer W. Therefore, the liquid resist PR irregularly spreads outward on the wafer W in a pattern of steaks, as shown in FIG. 11A. When the resist pattern PR is applied in a small amount, the streak pattern remains as coating streaks after the liquid resist PR spreads over the entire surface of the wafer W.

On the other hand, when the rotating speed of the wafer W is controlled in an S-shaped curve as in this variation, the liquid resist PR uniformly spreads outward on the wafer W as shown in FIG. 11B. This is because the rotating speed of the wafer W remains low, without a significant change, immediately after the liquid resist PR is supplied onto approximately the center of the wafer W, and therefore no strong centrifugal force acts on the liquid resist PR then. Because the rotating speed of the wafer W then continuously increases, the liquid resist PR spreads smoothly on the wafer W. This may be a reason why coating streaks are not formed even when the liquid resist PR is applied in a small amount.

In this variation, discharge of the liquid resist PR from the resist nozzle 86 may be continued from the first step S1' to an intermediate point in the second step S2. In this case, when terminating the discharge of the liquid resist PR, which has been continued to the intermediate point in the second step S2, the resist nozzle 86 may be moved to displace the liquid resist PR supply position from approximately the center of the wafer W. Thus, it is possible to continue the supply of the liquid resist from the first step S1' to an intermediate point in the second step S2 and, when terminating the supply of the liquid resist, displace the liquid resist supply position from approximately the center of the wafer W by moving the nozzle.

For example, simultaneously with the termination of the first step S1', the resist nozzle 86 is moved a predetermined distance, for example not less than 5 mm, preferably about 5 to 30 mm, from a position above approximately the center (central position A) of the wafer W while continuing discharge of the liquid resist PR from the resist nozzle 86, as shown in FIG. 12. Consequently, the position P on the wafer W, onto which the liquid resist PR is supplied, is displaced from approximately the center (central position A) of the wafer W. At that point in time, the rotating speed of the wafer W has been changed to the low second speed V2, e.g. about 100 rpm. The resist nozzle 86 stops at a position displaced from the position above approximately the center (central position A) of the wafer W, when the not-shown valve is closed to stop the discharge of the liquid resist PR. Thereafter, the wafer W continues to be rotated at the second speed V2, whereby the liquid resist PR on the wafer W is reshaped. Thus, as shown in FIG. 13, discharge of the liquid resist PR from the resist nozzle 86 is carried out from the first step S1' to an intermediate point in the second step S2 and, when terminating the discharge of the liquid resist PR in the second step S2, the resist nozzle 86 is moved to displace the liquid resist PR supply position P from approximately the center (central position A) of the wafer W.

According to this variation, the liquid resist PR drops onto the wafer W rotating at a low speed in the second step S2 at the end of the discharge of the liquid resist PR from the resist nozzle 86. Therefore, the liquid resist can be prevented from drying rapidly. In addition, because the liquid resist PR drops onto a position P displaced from approximately the center (central position A) of the wafer W, the liquid resist PR can be appropriately spread on the wafer W due to centrifugal force which is stronger than that in the center of the wafer W. Accordingly, even when the liquid resist which is unstable in amount and shape is discharged from the resist nozzle 86 at the end of the discharge of the liquid resist, there will be no formation of coating streaks in an area around the center of the wafer W. Thus, a uniform resist film can be finally formed on the entire surface of the wafer W even when the liquid resist is used in a small amount.

The following examples are given to further illustrate the present invention, and are not to be construed as limiting thereof.

The above-described resist coating unit COT was manufactured and, using the resist coating unit COT, an experiment was conducted to verify the advantageous effects of the present invention.

Example

Resist coating of a wafer was carried out based on the processing recipe, shown in Table 1 below, according to the resist coating method of the above-described embodiment. A series of resist coating tests was carried out in which a liquid resist was supplied in the first step S1 in varying amounts ranging from 0.3 to 1.0 ml, and a determination was made as to whether the entire wafer surface can be coated with the liquid resist. The determination was made by visual observation.

TABLE 1

| Step | Processing time (sec) | Rotating speed (rpm) | Acceleration (rpm/s) | Coating liquid |
|---|---|---|---|---|
| S0 | 0.3 | 2000 | 10000 | Solvent (thinner) |
| S1 | 2.0 | 3000 | 10000 | Liquid resist |
| S2 | 0.2 | 200 | 30000 | — |
| S3 | 2.5 | 1500 | 5000 | — |
| S4 | 20.0 | 1000 | 10000 | — |
| S5 | 0.4 | 0 | 10000 | — |

Comparative Example

Resist coating of a wafer was carried out based on the processing recipe, shown in Table 2 below, according to the conventional resist coating method. A series of resist coating tests was carried out in which a liquid resist was supplied in the first step S1 in varying amounts ranging from 0.3 to 1.0 ml, and a determination was made as to whether the entire wafer surface can be coated with the liquid resist. The determination was made by visual observation.

TABLE 2

| Step | Processing time (sec) | Rotating speed (rpm) | Acceleration (rpm/s) | Coating liquid |
|---|---|---|---|---|
| S0 | 0.3 | 2000 | 10000 | Solvent (thinner) |
| S1 | 2.0 | 3000 | 10000 | Liquid resist |
| S2 | 0.2 | 200 | 30000 | — |
| S4 | 20.0 | 1000 | 10000 | — |
| S5 | 0.4 | 0 | 10000 | — |

As a result, it was found that in the Example the entire wafer surface can be coated with the liquid resist even when the liquid resist is supplied in a small amount of 0.4 ml in the first step S1.

On the other hand, it was found that in the Comparative Example, at least 0.6 ml of the liquid resist needs to be supplied in the first step S1 in order to coat the entire wafer surface with the liquid resist: the use of the liquid resist in an amount less than 0.6 ml was unable to coat the entire wafer surface with the liquid resist.

As will be appreciated from the above results, the resist coating method according to the present invention makes it possible to coat the entire surface of a wafer with a liquid resist even when the liquid resist is supplied in such a small amount as not to be able to coat the entire wafer surface with the liquid resist by the conventional method. Thus, a liquid resist in a smaller amount can be efficiently applied to the entire surface of a wafer by the resist coating method according to the present invention.

While the present invention has been described with reference to the preferred embodiments, the present invention is not limited to the particular embodiments. It will be understood that various changes and modifications may be made to the embodiments within the scope of the present invention. For example, while coating with a liquid resist has been described by way of example, the present invention can be applied to coating with a coating liquid other than a liquid resist, for example, a coating liquid to form an antireflection film, an SOG (spin on glass) film or an SOD (spin on dielectric) film. Though coating of a wafer W is carried out in the embodiments, the present invention can also be applied to coating of a substrate other than a wafer, such as an FPD (flat panel display), a photomask reticle, etc.

What is claimed is:

1. A coating method for applying a coating liquid to a substrate, comprising:
   a first step of rotating the substrate at a first rotating speed while supplying the coating liquid onto approximately the center of the rotating substrate;
   a second step of rotating the substrate at a second rotating speed which is lower than the first rotating speed;
   a third step of rotating the substrate at a third rotating speed which is higher than the second rotating speed; and
   a fourth step of rotating the substrate at a fourth rotating speed which is higher than the second rotating speed and lower than the third rotating speed,
   wherein the first, second, third and fourth steps are performed in this order.

2. The coating method according to claim 1, wherein the fourth rotating speed is lower than the first rotating speed.

3. The coating method according to claim 1, wherein the substrate has been rotated until the start of the first step at a fifth rotating speed which is lower than the first rotating speed, and wherein the fifth rotating speed is gradually and continuously increased after the start of the first step and the rotational acceleration of the substrate is gradually decreased so that the rotating speed of the substrate converges to the first rotating speed by the end of the first step.

4. The coating method according to claim 3, wherein the coating liquid is supplied by discharging it from a nozzle, and wherein the supply of the coating liquid is continued from the first step to an intermediate point in the second step and, when terminating the supply of the coating liquid, the liquid supply position on the substrate is displaced from said approximately the center of the substrate by moving the nozzle.

5. The coating method according to claim 4, wherein the movement of the nozzle is started simultaneously with the end of the first step.

6. The coating method according to claim 1, wherein the coating liquid supplied onto the substrate is spread outwardly from the center of the substrate in the first step, the spread coating liquid is reshaped in the second step, and the reshaped coating liquid is further spread outwardly on the substrate in the third step.

7. The coating method according to claim 1, wherein the coating liquid loses its fluidity in the course of the fourth step.

8. The coating method according to claim 1, wherein the coating liquid is forced out of the substrate and the coating liquid on the substrate is dried in the fourth step.

9. The coating method according to claim 1, wherein the coating liquid is a liquid resist.

* * * * *